(12) United States Patent

Troost et al.

(10) Patent No.: US 8,009,269 B2
(45) Date of Patent: Aug. 30, 2011

(54) OPTIMAL RASTERIZATION FOR MASKLESS LITHOGRAPHY

(75) Inventors: Kars Zeger Troost, Waalre (NL); Jason Douglas Hintersteiner, Norwalk, CT (US); Minne Cuperus, Veldhoven (NL); Kamen Hristov Chilov, Eindhoven (NL); Richard Carl Zimmerman, Brookfield, CT (US); Ronnie Florentius Van T Westeinde, Ridgefield, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 889 days.

(21) Appl. No.: 11/686,136

(22) Filed: Mar. 14, 2007

(65) Prior Publication Data

US 2008/0224251 A1   Sep. 18, 2008

(51) Int. Cl.
*G03B 27/42* (2006.01)
(52) U.S. Cl. ............................................ 355/53; 355/55
(58) Field of Classification Search ....................... 355/53
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,486,896 A * | 1/1996 | Hazama et al. | 355/71 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,285,488 B1 * | 9/2001 | Sandstrom | 359/290 |
| 6,366,341 B1 * | 4/2002 | Shirato et al. | 355/69 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,870,554 B2 | 3/2005 | Jain | |
| 6,870,601 B2 | 3/2005 | Liebregts et al. | |
| 2005/0007572 A1 | 1/2005 | George et al. | |
| 2005/0018997 A1 | 1/2005 | Bleeker | |
| 2005/0170267 A1 * | 8/2005 | Bleeker et al. | 430/5 |
| 2005/0270513 A1 * | 12/2005 | Dierichs et al. | 355/67 |
| 2006/0209313 A1 | 9/2006 | Van Den Akker et al. | |

FOREIGN PATENT DOCUMENTS

| | | |
|---|---|---|
| EP | 0 602 634 A1 | 6/1994 |
| WO | WO 98/33096 A1 | 7/1998 |
| WO | WO 98/38597 A2 | 9/1998 |
| WO | WO 98/38597 A3 | 9/1998 |

* cited by examiner

*Primary Examiner* — Edward J Glick
*Assistant Examiner* — Mesfin T Asfaw
(74) *Attorney, Agent, or Firm* — Sterne, Kessler, Goldstein & Fox P.L.L.C.

(57) ABSTRACT

A lithographic system is provided in which an extent of overlap between pattern sections is adjusted in order to match a size of a pattern section to a size of a repeating portion of the pattern to be formed.

21 Claims, 5 Drawing Sheets

OPTIMAL RASTERIZATION FOR MASKLESS LITHOGRAPHY

BACKGROUND

1. Field of the Invention

The present invention relates to a lithographic system and device manufacturing method for optimizing rasterization in maskless lithography.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Substrates used in a lithographic apparatus are typically of a standard size. The devices formed using a lithographic process, such as integrated circuit devices tend to be significantly smaller than the standard substrate. Accordingly, a plurality of devices of a given type are typically formed on each substrate. As will be appreciated, in mask-based lithography a cost saving can be realized by using a single mask to repeatedly expose the same pattern on a plurality of different areas on the substrate. The mask, for example, provides the pattern necessary to form a layer of a single device or can provide the pattern for a layer of several adjacent devices, depending on the size of the device to be formed relative to the size of the exposure field of the lithographic apparatus. The lithographic apparatus can be arranged such that it can be used with masks of different sizes in order to accommodate conveniently the manufacture of devices of different sizes.

In a maskless lithographic apparatus, e.g., one using a programmable patterning device rather than a mask, the apparatus is inherently capable of being used for the manufacture of devices of any size (up to the size of the substrate) and, indeed, can be used to manufacture a plurality of different devices on a single substrate because the programmable patterning device can be set to provide any required pattern. However, the data processing architecture required to convert a desired pattern into the necessary control signals for a programmable patterning device is a significant portion of the cost of a maskless lithographic apparatus. Accordingly, it is desirable to minimize the cost of the data processing architecture where possible.

Therefore, what is needed is a system and method in which the cost of a data processing architecture used to provide control signals for a programmable patterning device can be reduced.

SUMMARY

In one embodiment, there is provided a lithographic apparatus comprising one or more arrays of individually controllable elements, a projection system, and a controller. The one or more arrays of individually controllable elements are configured to modulate a beam of radiation. The projection system is configured to project the modulated beam of radiation onto a substrate. The controller is configured to control the lithographic apparatus, such that it exposes a pattern of radiation on the substrate. The pattern comprises a plurality of regions in which a common pattern portion is repeated, and in which the pattern is formed from a plurality of pattern sections. Each pattern section corresponds to radiation modulated by an array of individually controllable elements. The controller is configured to control an extent of overlap of pattern sections, in a first direction, such that a part of a common pattern portion, exposed in two or more regions of the pattern exposed on the substrate, is exposed by a part of a beam of radiation modulated by the same part of one of the one or more arrays of individually controllable elements.

In another embodiment, there is provided a device manufacturing method, comprising the following steps. Modulating a beam of radiation using one or more arrays of individually controllable elements. Projecting the modulated beam of radiation onto the substrate. The pattern of radiation exposed on the substrate comprises a plurality of regions, in which a common pattern portion is repeated, and the pattern is formed from a plurality of pattern sections. Each pattern section corresponding to a section of a beam of radiation modulated by an array of individually controllable elements. The extent of overlap of pattern sections, in a first direction, is controlled such that a part of a common pattern portion, exposed in two or more regions of the pattern exposed on the substrate, is exposed by a part of a beam of radiation modulated by the same part of one or more arrays of individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 1 depicts a lithographic apparatus.
FIG. 2 depicts an arrangement of optical engines.
FIG. 3 depicts a pattern to be exposed on a substrate.
FIGS. 4a, 4b, 4c and 4d illustrate the exposure of a plurality of pattern sections on a substrate.

Figure 1:
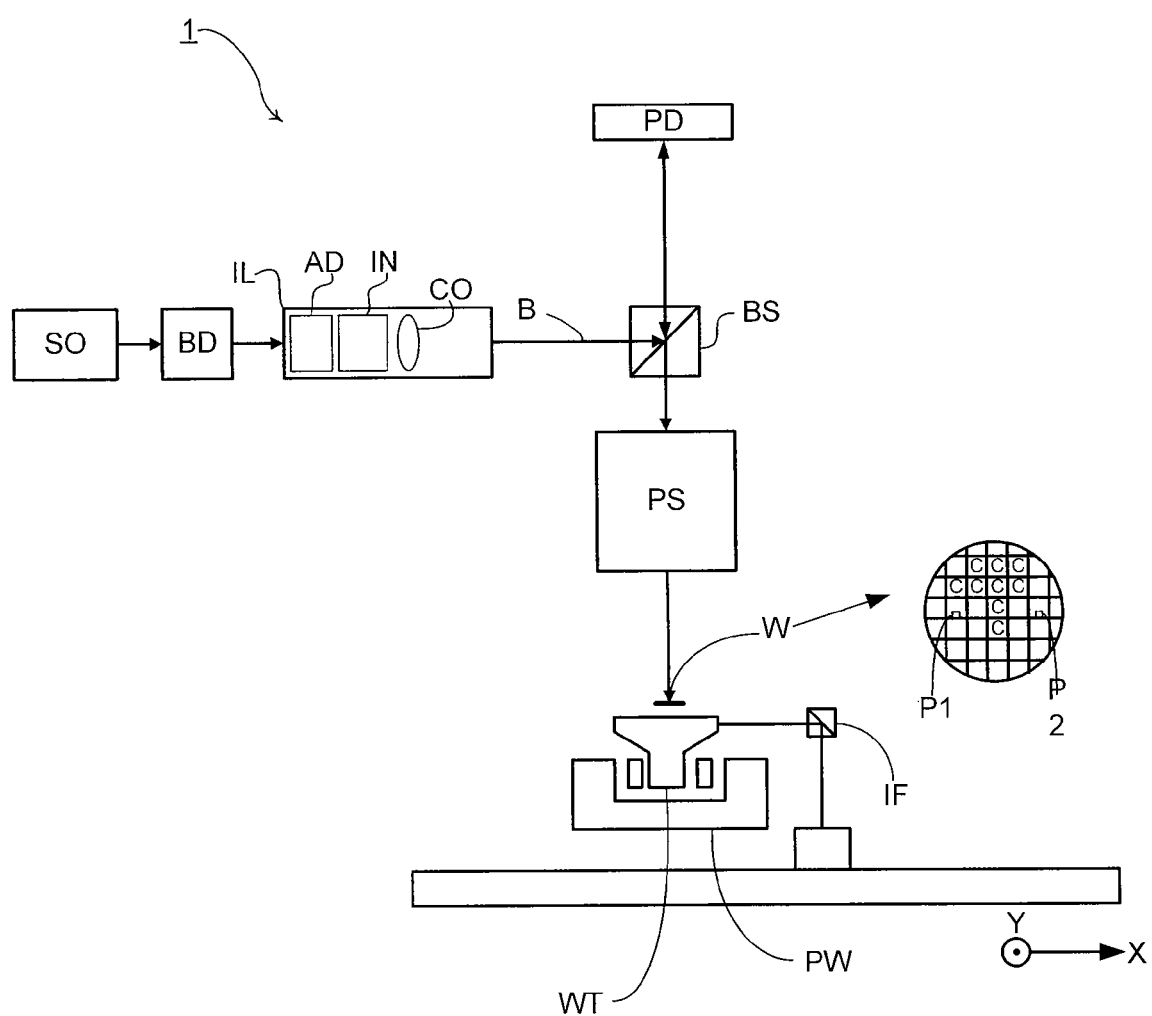

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 μm, at least 100 μm, at least 200 μm, at least 300 μm, at least 400 μm, at least 500 μm, or at least 600 μm. Alternatively, the thickness of the substrate can be at most 5000 cm, at most 3500 cm, at most 2500 cm, at most 1750 cm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
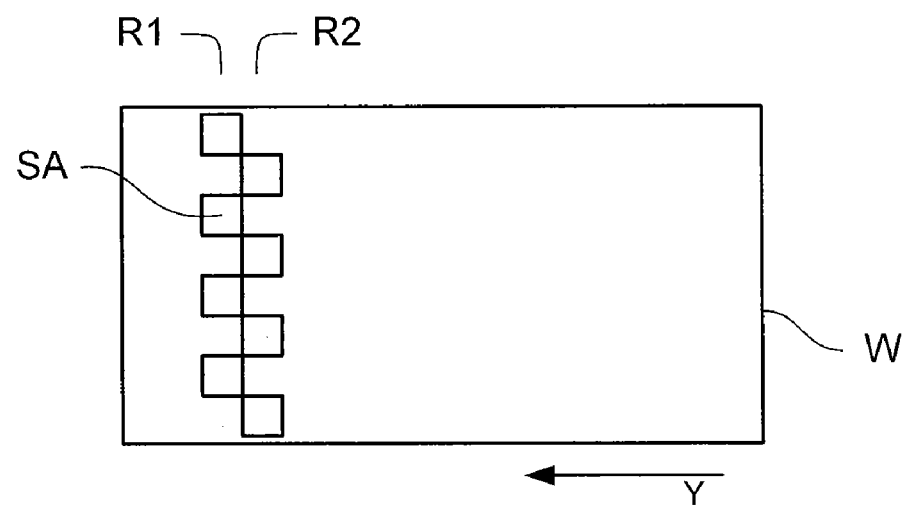

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 3:
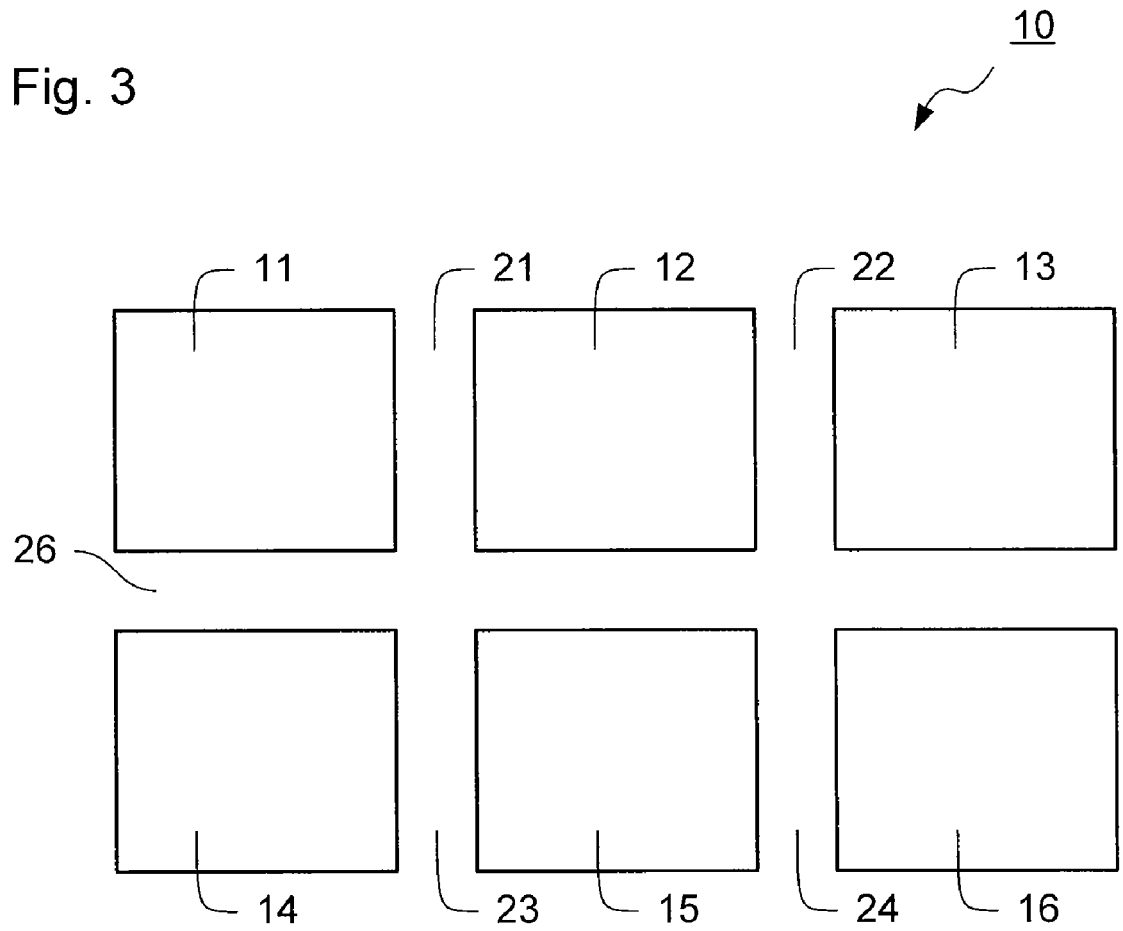

As discussed above, a plurality of devices of a given type can be formed on a single substrate. Accordingly, during the formation of a given layer of the device, a common pattern portion can be exposed in a plurality of regions on the substrate. This is depicted in FIG. 3, which shows a plurality of common pattern portions exposed on a part of a substrate. As shown, a pattern 10 exposed on the substrate includes a plurality of common pattern portions 11, 12, 13, 14, 15, and 16. When multiple devices are formed on a single substrate they are separated by scribe lanes, which allow the individual devices to be separated by dicing the substrate. Accordingly, the common pattern portion 11, 12, 13, 14, 15, and 16 are separated by portions 21, 22, 23, 24, 25, and 26 of the pattern 10 that correspond to the scribe lanes.

In a maskless lithographic apparatus, the beam of radiation projected onto the substrate is modulated by an array of individually controllable elements, e.g., a programmable device for patterning the beam of radiation. The size of such arrays of individually controllable elements is limited. This is partly because, as the array of individually controllable elements becomes larger, it becomes more difficult to provide the control signals to the array of individually controllable elements. This is also partly because, as the array of individually controllable elements becomes larger, it becomes more difficult to dissipate the heat generated within the array of individually controllable elements in use. This is further partly because the cost of manufacturing the array of individually controllable elements becomes excessive as the array becomes larger due to the difficulty in providing a larger number of individually controllable elements in a single array without defects or in which the defects are below an acceptable level. As a consequence, the size of the common pattern portions 11, 12, 13, 14, 15, and 16 can be significantly larger than the size of a section of the modulated beam of radiation projected onto the substrate that corresponds to a single array of individually controllable elements. Consequently, each common pattern portion is made up from a plurality of pattern sections that each are exposed by radiation modulated by a single array of individually controllable elements.

In order to ensure that the pattern 10 on a substrate is correctly formed, it is desirable to ensure that each of the pattern sections is highly accurately positioned relative to the other pattern sections. However, it has been found that the effect of any residual errors in the accuracy of the relative positioning of the pattern sections can be reduced by arranging adjacent pattern sections to overlap at their boundary. In these overlap portions, the intensity of the radiation projected onto the substrate in each pattern section is reduced, such that the combined radiation of intensity projected onto the substrate in the overlap portion is the same as the radiation intensity in the non-overlapping portions (subject to the modulation to provide the required pattern). This is commonly referred to as "stitching." A variety of stitching arrangements are known in the art, for example reducing the radiation intensity to one half in each overlapping portion of the pattern section or linearly reducing the intensity of the radiation to zero across the overlapping portions of each pattern section. However, one or more embodiments of the present invention are not limited to the use of any particular stitching configuration or profile and any convenient configuration can be used with the present invention.

Figure 4A:
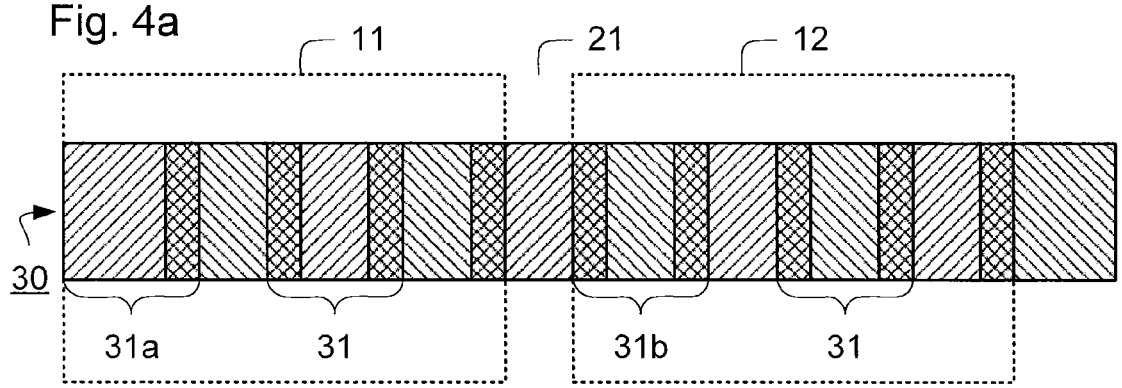

FIG. 4a depicts how a plurality of overlapping pattern sections can be combined to provide the pattern on the substrate. In the arrangement depicted in FIG. 4a, the row 30 of overlapping pattern sections 31 provides a part of the pattern for two common pattern portions 11,12 and a pattern portion 21 between them. In FIG. 4a, for clarity, adjacent pattern sections 31 are shaded differently and the overlap regions include both types of shading.

It will be appreciated that, in practice, the row 30 of overlapping pattern section 31 can extend across the entirety of the substrate, and that to provide the pattern for the entirety of the substrate a plurality of rows of overlapping pattern sections will be used. It should also be appreciated that the relative size of the pattern section 31 and the common pattern portions 11, 12 shown in FIG. 4a is illustrative only and, in practice, the patterned sections can be relatively far smaller than the common pattern portions 11,12. Likewise, the proportion of the pattern section 31 that overlaps with adjacent pattern sections can be smaller than that shown in FIG. 4a.

Figure 4B:
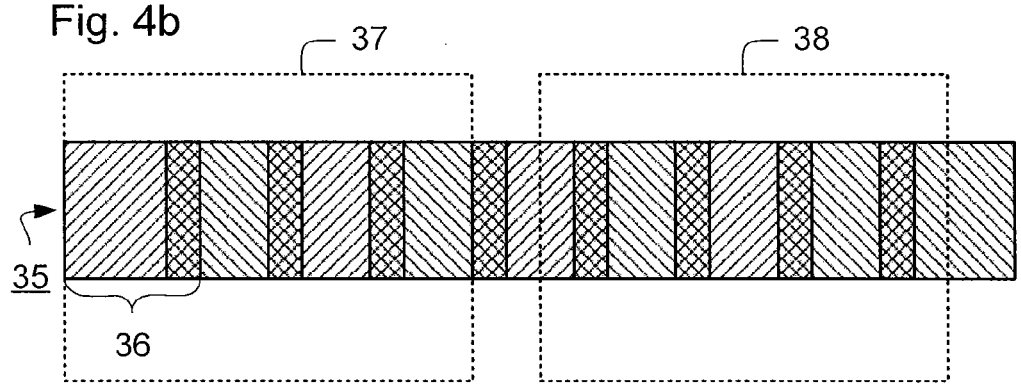

FIG. 4b shows an effect of simply setting different patterns on the array of individually controllable elements for each pattern section. In this case, a row 35 of overlapping patterns sections can be used to provide the pattern for common pattern portions 37,38 that are a different size relative to the size of the overlapping pattern section 36 from the arrangement depicted in FIG. 4a.

However, the arrangement depicted in FIG. 4a can have an important benefit compared to the arrangement depicted in FIG. 4b. In particular, in the arrangement shown in FIG. 4a, the size of the pattern section 31 relative to the size of the common pattern portion 11,12 and the size of the separating pattern portion 21 is such that a first pattern section 31a is in substantially the same position relative to the first common pattern portion 11 as a second pattern section 31b is relative to a second common pattern portion 12. Consequently, the pattern to be produced in the first pattern section 31a is identical to the pattern to be produced in the second pattern section 31b. This can be beneficial because in order to provide a given pattern, it is desirable to calculate the control signals that are provided to an array of individually controllable elements in order to generate the required pattern. These calculations are complex and can, in particular, compensate for variations in the response of each of the individually controllable elements within the array of individually controllable elements and optical effects within, for example, the projection system that can vary across the exposure field. Accordingly, different control signals can be required for a given piece of the pattern if it is to be generated by a different piece of the array of individually controllable elements. In the arrangement shown in FIG. 4a, however, the pattern sections 31a,31b to be generated by the array of individually controllable elements for the first and second common pattern portions 11,12 are substantially identical. Accordingly, it is possible to calculate the control signals desired for the array of individually controllable elements once and then use the same control signal for setting the array of individually controllable elements for exposing a pattern section for both the first common pattern portion 11 and the second common pattern portion 12. However, this may not be possible for the situation depicted in FIG. 4b because none of the pattern sections 36 used to form the first common pattern portion 37 correspond to the pattern sections 36 used to form the second pattern portion 38.

In general, the size of the common pattern portion and the size of the separation between them may not be fixed. Accordingly, if the arrangement of the pattern sections remains fixed, the situation depicted in FIG. 4b, in which none of the pattern sections used to form a first common pattern portion correspond to the pattern sections used to form a second common pattern portion, will usually occur. This is disadvantageous because in the arrangement depicted in FIG. 4a, calculated control signals for setting the array of individually controllable elements can be re-used. However, in the arrangement depicted in FIG. 4b the control signals to set the array of individually controllable elements must be calculated for each pattern section. Accordingly, fewer calculations are required to generate the pattern on the substrate for the arrangement depicted in FIG. 4a than that of the arrangement depicted in FIG. 4b, providing an opportunity to decrease the total calculation time and/or reduce the cost of the data processing architecture.

Figure 4C:
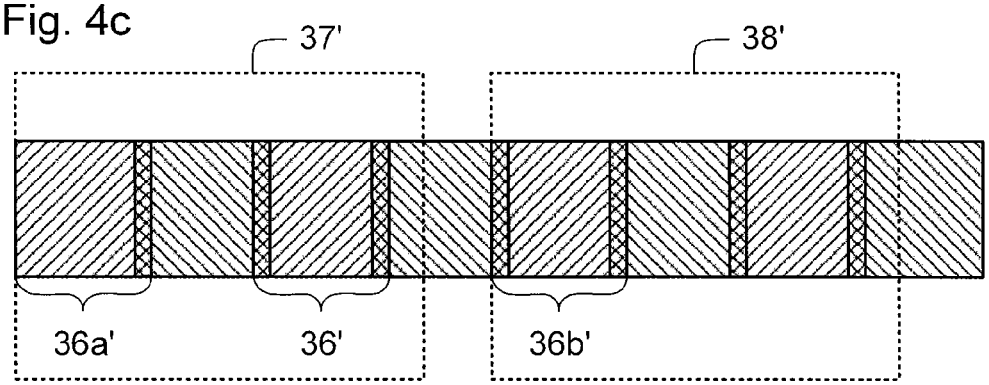

Therefore, according to one or more embodiments of the present invention the lithographic apparatus is arranged, such that the extent of the overlap between adjacent pattern sections can be controlled. FIG. 4c depicts a situation corresponding to that of FIG. 4b, e.g., in which the size of the pattern sections 36' relative to the common pattern portions 37', 38' is the same. However, each proportion of the pattern section 36' that overlaps with adjacent pattern sections is different from that depicted in FIGS. 4a and 4b such that, as with the arrangement depicted in FIG. 4a, a first pattern section 36a' used to form the first common pattern portion 37' is the same as a second pattern section 36b' used to form the second common pattern portion 38'. Accordingly, the same control signals can be used and the data processing architecture can be reduced because fewer calculations will be required to provide the pattern on the substrate.

It will be appreciated that, by appropriate control of the overlap of the pattern sections, it is possible to ensure that pattern sections used for each common pattern portion in a row of pattern sections can be the same, regardless of the relative size of the pattern sections and the common pattern portion. Therefore for a given lithographic apparatus with a given size of arrays of individually controllable elements and given magnification of the projection system, e.g., a given size of pattern section projected onto the substrate corresponding to an array of individually controllable elements, patterns having any size of common pattern portion and any separation of the common pattern portions can be projected onto the substrate using common control signals to set the array of individually controllable elements for each of the common pattern portions.

Figure 4D:
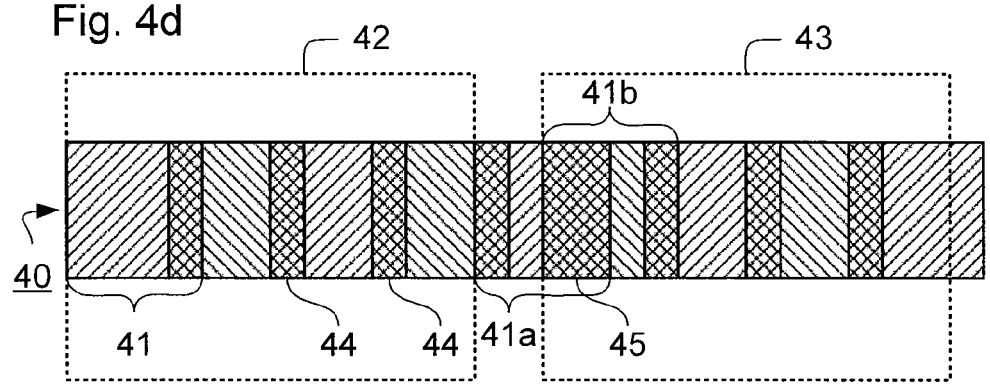

In the arrangement depicted in FIG. 4c, the overlap between each of the pattern sections 36' is adjusted equally, such that the overlap is the same for each boundary between adjacent pattern sections in the row. However, this need not be the case. For example, the overlap at a first group of one or more boundaries between adjacent pattern sections associated with a first common pattern portion can have a different size from the overlap at a second group of one or more boundaries of adjacent pattern sections also associated with the first common pattern portion. FIG. 4d depicts such an arrangement.

In particular, FIG. 4d depicts a row 40 of pattern sections 41 used to form first and second common pattern portions 42,43. In this case, all but one of the overlap portions 44 are the same size (and can be fixed, regardless of the relative sizes of the pattern sections 41 and the common pattern portion 42,43) and the remaining overlap portion 45 between two pattern sections 41a,41b is a different size. Accordingly, in order to adapt the lithographic apparatus for use with different sizes of common pattern portions, changing the size of one of the overlap regions may be all that is needed.

In some situations, the pattern to be exposed on a substrate can include more than one type of repeating common pattern portion. This can occur, for example, during the manufacture of CCD (charge couple device) chips. Furthermore, the size of a first plurality of common pattern portions can be different from the size of a second plurality of common pattern portions. Accordingly, in order to ensure that the same control signals can be used to set the array of individually controllable elements for each of the common pattern portions within the first plurality of common pattern portions and the second plurality of common pattern portions, respectively, the extent of overlap between adjacent pattern sections associated with the first plurality of common pattern portion can be set to be different from the extent of overlap of the adjacent pattern sections associated with the second plurality of common pattern portions.

It should be appreciated that, in the same manner as discussed above, the extent of overlap between adjacent pattern sections can be the same for all boundaries between adjacent pattern sections associated with either the first or second plurality of common pattern portions. Alternatively, the necessary adjustment can be made to only a limited number of the boundaries between adjacent pattern sections (or even at only one boundary) for each common pattern portion of the first or second plurality of common pattern portions.

Where the extent of overlap of adjacent pattern portions is set to be the same for all boundaries between adjacent pattern sections within a common pattern portion, there can be an abrupt change in the extent of overlap between adjacent pattern sections at the interface between a common pattern portion of a first plurality of common pattern portions and a common pattern portion of a second plurality of common pattern portions. Alternatively, at the interface between common pattern portions of different pluralities of common pattern portions where each of the different types of common pattern portions are associated with a different extent of overlap between adjacent pattern sections, the extent of overlap can be arranged to change gradually across a given number of boundaries between adjacent pattern sections. This can be beneficial, for example, if the extent of overlap between adjacent pattern sections is controlled by adjusting the speed of the substrate relative to the projection system. In such a situation, the control of the motion of the substrate relative to the projection system is simplified if the extent of overlap (and, consequently, the relative speed of substrate) is to change gradually rather than abruptly.

As discussed above, a plurality of overlapping pattern sections can be exposed on the substrate in order to expose a portion of the pattern on the substrate. In a simple case, the lithographic apparatus can have a single array of individually controllable elements that modulates the beam of radiation in order to generate the pattern section. Accordingly, the lithographic pattern apparatus can include an actuator system that moves the substrate relative to a combination of the projection system and the array of individually controllable elements in a direction parallel to the orientation of the row of overlapping pattern sections to be formed. After each pattern section is exposed at each requisite location on the substrate, the substrate is advanced in the direction parallel to the orientation of the row and the next pattern section is exposed. The motion of the substrate relative to the projection system can be stopped for each exposure. However, in practice, the actuator system can move the substrate relative to the projection system at a constant velocity and a pulsed beam of radiation can be used, the pulses of the radiation system timed to provide each subsequent exposure at the required location and the pattern on the array of individually controllable elements being updated between each pulse. In such a system, the extent of the overlap between adjacent pattern sections can be adjusted by controlling one or both of the timing of the pulses of the radiation system, e.g., changing the frequency of the pulses of the radiation system, and the speed and/or position of the substrate relative to the projection system.

The lithographic apparatus can include additional arrays of individually controllable elements that each modulate portions of the beam of radiation in order to provide pattern sections. For example, the lithographic apparatus can include additional arrays of individually controllable elements set apart from each other in a direction parallel to the orientation of the rows of pattern sections discussed above. In this case, adjacent pattern sections within a row can be exposed by radiation modulated by different arrays of individually controllable elements and can be exposed by different pulses of the radiation system. In such an arrangement, an actuation system can be provided to adjust the separation of the two arrays of individually controllable elements in the direction parallel to the orientation of the rows of pattern sections when adjusting the extent of the overlap. Alternatively or additionally, the lithographic apparatus can include two or more arrays of individually controllable elements arranged to project pattern sections onto the substrate that are separated in a direction perpendicular to the row of pattern sections discussed above. In this case, each array of individually controllable elements can be used to modulate radiation to expose some or all of the pattern sections within a separate row such that more than one row of pattern sections can be exposed simultaneously. It will be appreciated that the pattern sections of such two or more rows exposed simultaneously can be arranged to overlap in order to provide a stitching region at the boundary of the rows of pattern sections that are exposed simultaneously.

In summary, therefore, in one example as the substrate is moved relative to the projection system in a direction parallel to the direction of the rows of pattern sections discussed above, a stripe of pattern is exposed on the substrate, the stripe including one or more rows of pattern sections that correspond to radiation modulated by an array of individually controllable elements.

As explained above, by adjusting the extent of the overlap of the pattern section within each row it becomes possible to use the same control signals for a plurality of pattern sections within each row, e.g., for corresponding pattern sections within each common pattern portion. In a similar manner, by adjusting the extent of overlap between adjacent stripes of patterns, it is possible to ensure that, regardless of the size of the common pattern portion relative to the width of the stripe of pattern, the pattern required for a portion of a stripe used to form a first row of common pattern portions is the same as the pattern for a portion of a stripe used to form a second row of common pattern portions.

Figure 5:
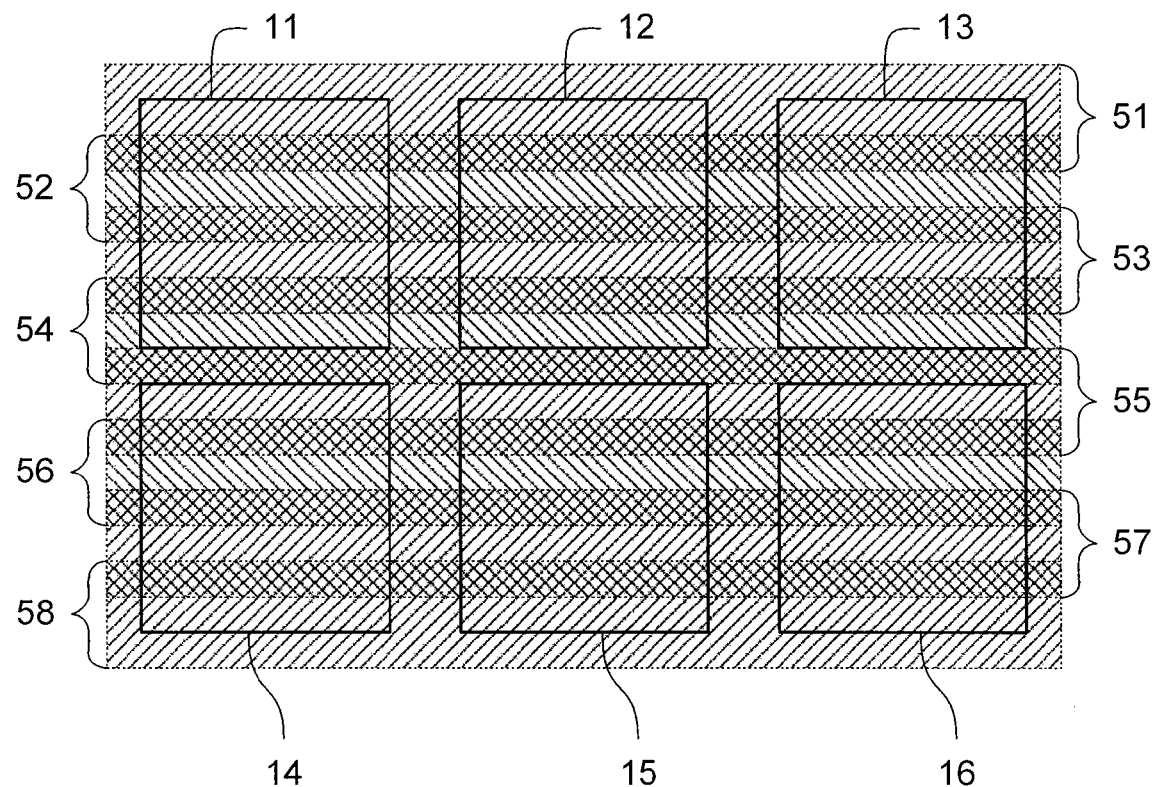
FIG. 5 depicts the exposure of a plurality of stripes of pattern onto the substrate.

For example, FIG. 5 depicts a first row of common pattern portions 11,12,13 and a second row of common pattern portions 14,15,16. The first row of common pattern portions 11,12,13 is formed from stripes 51,52,53,54 of pattern and the second row of common pattern portions 14,15,16 is formed from stripes 55,56,57,58 of pattern. The extent of overlap between adjacent stripes is arranged such that the pattern required of the first stripe 51 of pattern to form the first row of common pattern portions 11,12,13 is the same as the pattern required for the first stripe 55 of pattern required to form the second row of common pattern portions 14,15,16 and so on. As with FIGS. 4a, 4b, 4c and 4d, in FIG. 5 for clarity, adjacent stripes of pattern are shaded differently and the regions of overlap between stripes include both types of shading.

In the arrangement depicted in FIG. 5, the extent of overlap between adjacent stripes of pattern is adjusted, such that it is the same for all stripes used to form each of the common pattern portions within a row. It should be appreciated, however, that this need not be the case and that one or more of the overlaps between adjacent stripes can be a different size from one or more other overlaps between adjacent stripes for a given row of common pattern portions. For example, all but one of the overlap regions between adjacent stripes can be fixed for each row of common pattern portions and a single overlap region between adjacent stripes can be adjusted in order to provide all of the adjustment necessary for a given row of common pattern portions.

It should be appreciated that between the exposure of successive stripes of pattern, the substrate is moved relative to the projection system in a direction perpendicular to the orientation of the stripes, e.g., perpendicular to the orientation of the rows of pattern sections discussed above. In order to adjust the extent of overlap between adjacent stripes, it is merely necessary to adjust the extent that the substrate is moved relative to the projection system between successive stripes.

Alternatively or additionally, in order to ensure that, regardless of the relative size of the common pattern portions and the width of the stripe, the same pattern is used for stripes of pattern forming different rows of common pattern portions, the width of one or more stripes can be adjusted. For example, the width of all stripes can be adjusted such that all of the stripes have a common width in a direction perpendicular to the orientation of the stripes. Alternatively, one or more of the stripes can have a different width from one or more other stripes used to form each row of common pattern portion. For example, all of the stripes except one can have a fixed width and one stripe can have its width reduced in order to make all of the necessary adjustment.

The width of a stripe can be reduced by appropriately setting some or all of the individually controllable elements of one or more of the arrays of individually controllable elements used to modulate the beam of radiation such that radiation is not projected onto the substrate in the corresponding portion of the modulated beam of radiation. Alternatively or additionally, a moveable barrier can be provided to prevent a portion of the modulated beam of radiation from being projection onto the substrate. Alternatively or additionally, the moveable barrier or a second moveable barrier can prevent part or all of one or more of the arrays of individually controllable elements from being illuminated by the beam of radiation.

Figure 6:
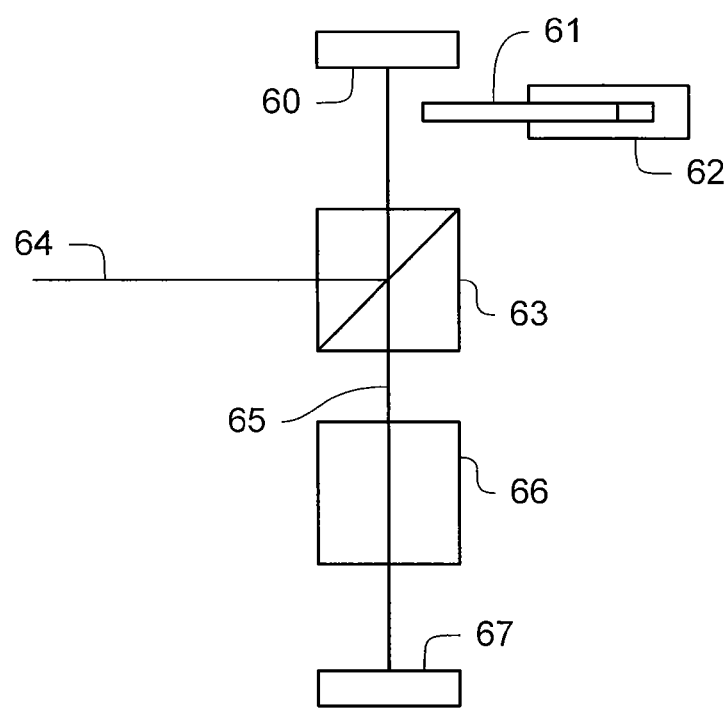
FIG. 6 depicts an arrangement of a lithographic apparatus.

FIG. 6 depicts schematically an arrangement for a movable barrier of the kind discussed above. As with the arrangement depicted in FIG. 1, the lithographic apparatus includes a partial reflector 63 for directing a beam of radiation 64 to the array of individually controllable elements 60 which modulates the beam of radiation and reflects it through the partial reflector 63 and the modulated beam of radiation 65 is then projected onto the substrate 67 by the projection system 66. As shown, a movable barrier 61 is provided, together with an actuator 62 that is used to control the position of the movable barrier 61. Depending on the location of the movable barrier 61, part of the beam of radiation 64 is prevented from illuminating a corresponding part of the array of individually controllable elements 60. It will be appreciated that a movable barrier 61 and associated actuator 62 can alternatively or additionally be provided between the partial reflector 63 and the projection system 66 and/or between the projection system 66 and the substrate 67 in order to control the proportion of the modulated beam of radiation 65 that is projected onto the substrate 67.

In a system in which a plurality of arrays of individually controllable elements are provided, a movable barrier as discussed above can be provided for each array of individually controllable elements. Alternatively or additionally, a movable barrier can be provided that controls the proportion of the part of the pattern beam, corresponding to multiple or all of the arrays of individually controllable elements, that is projected onto a substrate.

It should be appreciated that, although in the examples provided above, each row of common pattern portions contains the same number of common pattern portions, in general this need not be the case. Furthermore, common pattern portions in different rows of common pattern portions need not be aligned with each other. However, as will be appreciated, by combining the adjustment of the extent of the overlap of pattern sections within each row and adjusting the width and/or extent of overlap of adjacent stripes, it can be ensure that, regardless of the relative size of the pattern section and the common pattern portions, each of the common pattern portions is made up from pattern sections that are identical to the pattern sections used to form each of the other common pattern portions on the substrate. Accordingly, it is possible to calculate the control signals necessary to set the array(s) of individually controllable elements for each pattern section within a common pattern portion and then to use the same control signal for all of the common pattern portions. Accordingly, a significant reduction in the calculating capacity of the data processing architecture of the lithographic apparatus can be realized.

As explained above, the common pattern portions can correspond to the pattern necessary to form a layer of an individual device being formed on the substrate. However, this need not be the case. In particular, the common pattern portions can, for example, correspond to a section of a device that is repeated a plurality of times within each device. It should further be appreciated that although a single common pattern portion can correspond to a single device being formed on the substrate, the common pattern portion may not provide the entirety of the pattern for a layer of the device. For example, part of the pattern for an individual device can be unique to each device, for example including a serial number or other device identification. In addition, as discussed above, each device can be separated by a scribe lane. The scribe lane typically in addition to providing separation between the devices to enable dicing of the substrate, include alignment markers and test features. Often, the alignment markers and test features are unique to each device to which they are adjacent. Accordingly, the control signals for setting the array(s) of individually controllable elements for the pattern sections corresponding to the alignment mark and test features must be calculated individually. In general, however, the size of such scribe lanes is kept to a minimum because it represents a portion of the substrate that is ultimately wasted. Consequently, the scribe lane is typically significantly smaller in width than a pattern section corresponding to radiation modulated by an array of individually controllable elements. Accordingly, therefore, each pattern section including a part of a scribe lane (and therefore can need to be calculated uniquely) also includes a part of the pattern for the device itself. Accordingly, the common pattern portion, e.g., the pattern sections that do not need to be calculated uniquely because they do not include part of the scribe lanes, does not include all of the pattern associated with the device.

Figure 7:
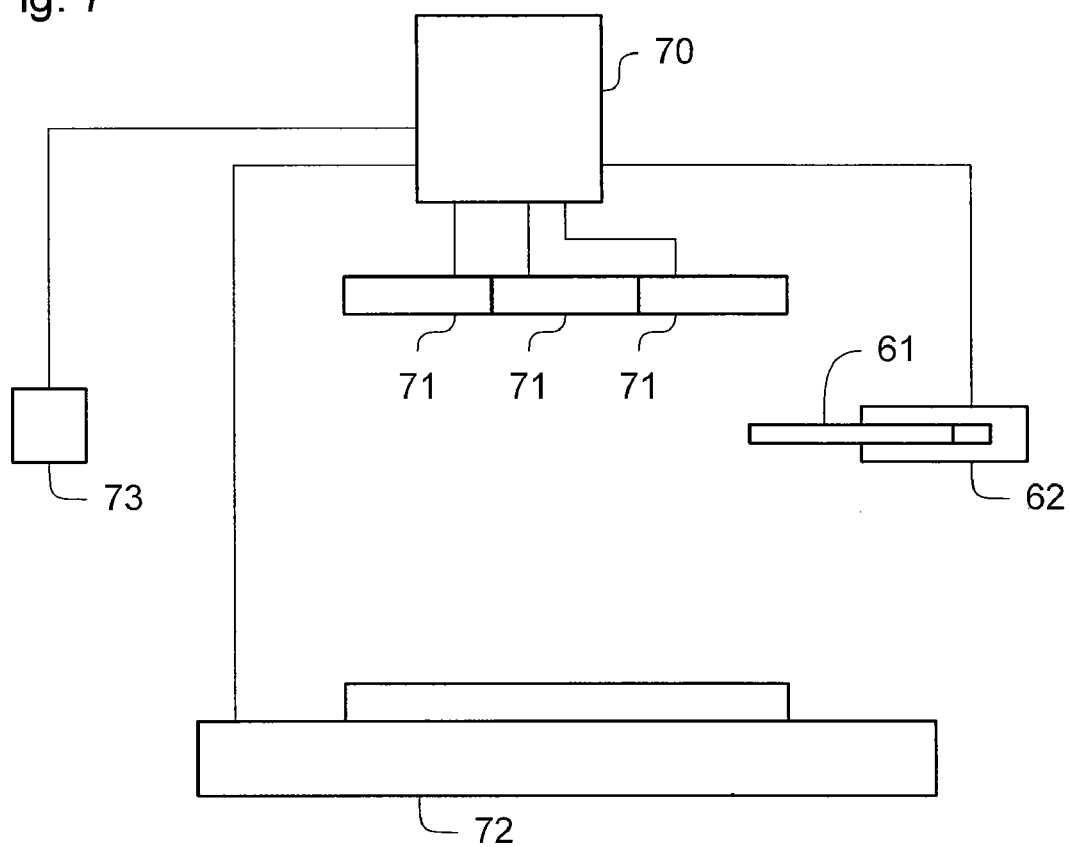
FIG. 7 depicts a control system that can be used.

FIG. 7 schematically represents a control system for a lithographic apparatus. As shown, the control system includes a controller 70 that is configured to control the lithographic apparatus. The controller 70 is connected to the radiation system in order to control the timing of exposures of radiation and an actuator system 72, which controls the position of the substrate relative to the projection system. The controller 70 is further connected to the one or more arrays of individually controllable elements 71 and provides the control signals to the one or more arrays of individually controllable elements 71. The controller is further connected to the actuator 61 for controlling a movable barrier 62 if the lithographic apparatus includes such an arrangement. The controller 70 is configured such that it controls these components as required in order to control the extent of overlap between adjacent pattern sections within a row of pattern sections and to adjust the width and/or extent of overlap between adjacent stripes of pattern. It should be appreciated that, although controller 70 is depicted in FIG. 7 as a single component, in practice the elements of the controller 70 can be distributed in separate components within the lithographic apparatus.

Figure 8:
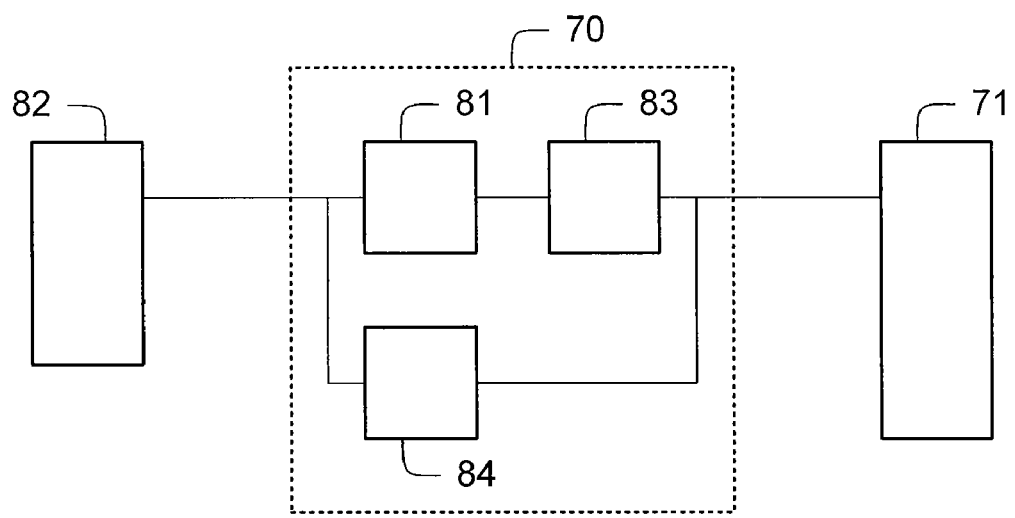
FIG. 8 depicts the configuration of a controller.

As discussed above, control signals for setting the array(s) of individually controllable elements for pattern section used for common pattern portion can be used for each of the common pattern portions. Accordingly, as shown in FIG. 8, the controller 70 can include a first processor 81 used to convert pattern data from a pattern data store 82 for pattern sections for a common pattern portion into control signals for the one or more arrays 71 of individually controllable elements and store these in a memory 83. The controller 70 can then provide the appropriate control signals to the one or more arrays 71 of individually controllable elements as required from the memory 83 without re-calculating the control signals required. The control system 70 can include a second processor 84 that calculates, as required, the control signals required to set the one or more arrays 71 of individually controllable elements for the remaining pattern sections, e.g., the non-repeating pattern sections. It will be appreciated that other configurations can be used for the control system.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus comprising:
a device configured to emit a modulated beam of radiation;
a projection system configured to project the modulated beam of radiation onto a substrate; and
a controller configured to control exposing a pattern of radiation on the substrate, wherein the pattern comprises first and second pattern portions corresponding to first and second features to be patterned on the substrate, wherein each of the first and second pattern portions include first and second pattern sections, and
wherein the controller is configured to control a width or height of an overlap of the first and second pattern sections, such that a first position in the first portion of the first pattern section forming the first feature substantially corresponds to a first position in the second portion of the first pattern section forming the second feature.

2. The apparatus according to claim 1, wherein:
the first and second pattern portions each further comprise a third pattern section; and
the controller is configured to control an extent of the overlap of the first, second, and third pattern sections in a first direction, such that the extent of the overlap in the first direction is the same for the first, second, and third pattern sections.

3. The apparatus according to claim 1, wherein:
the first and second pattern portions each further comprise a third pattern section; and
the controller is configured to control an extent of the overlap of the first, second, and third pattern sections in a first direction, such that the extent of the overlap in the first direction is different for at least one pair of adjoining first, second, and third pattern sections from that of at least one other pair of adjoining first, second, and third pattern sections.

4. The apparatus according to claim 1, wherein:
the controller is configured to expose the first and second pattern portions on the substrate by using the first and second pattern portions to expose a first row including the first and second pattern sections and using the first and second pattern portions to expose a second row including third and fourth pattern sections, the third and fourth pattern sections being similar to the first and second pattern sections in the first row, and
the first and second rows are parallel to a first direction.

5. The apparatus according to claim 4, further comprising:
an actuator system configured to move the substrate relative to the projection system in a direction parallel to the first direction, while the first and second rows are exposed on the substrate;
wherein the controller is configured to control an extent of the overlap of the first and second pattern sections and the third and fourth pattern sections by adjusting at least one of a relative speed of the substrate and projection system and a timing of exposure of one or more of the first, second, third, or fourth pattern sections.

6. The apparatus according to claim 4, wherein
the controller is configured to control an extent of an overlap of the first and second rows in a second direction, perpendicular to the first direction, such that a part of the first and second pattern portions are exposed by a part of the modulated beam of radiation.

7. The apparatus according to claim 6, wherein:
the controller is configured to expose the first and second pattern portions by using the first and second pattern portions to expose a third row including fifth and sixth pattern sections, the fifth and sixth pattern sections being similar to the first and second pattern sections in the first row; and
the controller is configured to control an extent of an overlap of the first, second, and third rows in the second direction, such that the extent of the overlap in the second direction is the same for first, second, and third rows.

8. The apparatus according to claim 6, wherein:
the controller is configured to expose the first and second pattern portions by using the first and second pattern portion to expose a third row including fifth and sixth pattern sections, the fifth and sixth pattern sections being similar to the first and second pattern sections in the first row; and
the controller is configured to control the extent of the overlap of the first, second, and third rows in the second direction, such that the extent of the overlap in the second direction is different for at least one pair of adjoining first, second, and third rows from that of at least one other pair of adjoining first, second and third rows.

9. The apparatus according to claim 4, wherein the controller is configured to control a width of the first or second row in a second direction, perpendicular to the first direction, such that a part of the first and second pattern portions is exposed by a part of the modulated beam of radiation modulated by a same part of the device.

10. The apparatus according to claim 9, wherein the controller is configured to control the width, in the second direction, of the first or second row, such that the width in the second direction is substantially equal for the first and second rows.

11. The apparatus according to claim 9, wherein the controller is configured to control the width, in the second direction, of the first or second row, such that the width in the second direction is different for the first and second rows.

12. The apparatus according to claim 9, wherein the controller is configured to control the width of the first or second row in the second direction by setting at least a part of the device, such that radiation is not exposed on the substrate by a corresponding portion of the modulated beam of radiation.

13. The apparatus according to claim 9, further comprising:
a movable barrier configured to prevent a controlled proportion of the cross-section of the modulated beam of radiation from being projected onto the substrate or a controlled proportion of the cross-section of the device from being illuminated by the beam of radiation;
wherein the controller is configured to control the width of the first or second row in the second direction by controlling a position of the movable barrier.

14. The apparatus according to claim 1, wherein:
the pattern further comprises third and fourth pattern portions corresponding to third and fourth features to be patterned on the substrate, wherein each of the third and fourth pattern portions include first and second pattern sections; and
the controller is configured to control a width or height of an overlap, in a first direction, of the first and second pattern sections of the third and fourth pattern portions independently of the control of the width or height of the overlap of the first and second pattern sections of the first and second pattern portions, such that a first position in the third pattern portion of the first pattern section forming the third feature substantially corresponds to a first position in the fourth pattern portion of the first pattern section forming the fourth feature.

15. The apparatus according to claim 1, wherein the first and second pattern portions correspond to a portion of the substrate on which a discrete device is to be formed.

16. The apparatus according to claim 1, further comprising:
   a data processor configured to convert pattern data, corresponding to the first and second pattern portions, into corresponding control signals for the device; and
   a memory configured to store the control signals,
   wherein the stored control signals are provided to the device in order to expose the first and second pattern portions in a plurality of regions on the substrate.

17. The apparatus according to claim 16, wherein the first and second pattern portions are repeated and separated by non-repeating pattern portions.

18. The apparatus according to claim 17, further comprising:
   a second data processor configured to convert pattern data, corresponding to the non-repeating pattern portions, into corresponding control signals for the device.

19. A method, comprising:
   modulating a beam of radiation;
   projecting first and second pattern sections formed in the modulated beam of radiation onto the substrate to form first and second pattern portions that correspond to first and second features on the substrate; and
   controlling a width or height of an overlap of the first and second pattern sections, such that a first position in the first portion of the first pattern section forming the first feature substantially corresponds to a first position in the second portion of the first pattern section forming the second feature.

20. The method of claim 19, wherein
   the controlling the width or height of the overlap comprises exposing a first row including first and second pattern sections and exposing a second row including third and fourth pattern sections using the first and second pattern portions the third and fourth pattern sections being similar to the first and second pattern sections in the first row;
   the first and second rows are parallel to a first direction.

21. The method of claim 20, further comprising:
   moving the substrate, with an actuator system, relative to a projection system in a direction parallel to the first direction, while the first, second, third, and fourth pattern sections are exposed on the substrate; and
   wherein controlling the width or height of the overlap of the first, second, third, and fourth pattern sections comprises adjusting at least one of a relative speed of the substrate and projection system and a timing of exposure of the first, second, third, or fourth pattern sections.

* * * * *